United States Patent
Oh et al.

(10) Patent No.: US 8,461,575 B2
(45) Date of Patent: Jun. 11, 2013

(54) ORGANIC LIGHT-EMITTING DISPLAY DEVICE AND METHOD OF MANUFACTURING THE SAME

(75) Inventors: Min-Ho Oh, Yongin (KR);
Yoon-Hyeung Cho, Yongin (KR);
So-Young Lee, Yongin (KR);
Byoung-Duk Lee, Yongin (KR);
Sun-Young Lee, Yongin (KR);
Jong-Hyuk Lee, Yongin (KR)

(73) Assignee: Samsung Display Co., Ltd., Giheung-Gu, Yongin, Gyeonggi-Do (KR)

(*) Notice: Subject to any disclaimer, the term of this patent is extended or adjusted under 35 U.S.C. 154(b) by 207 days.

(21) Appl. No.: 12/907,197

(22) Filed: Oct. 19, 2010

(65) Prior Publication Data
US 2011/0140119 A1 Jun. 16, 2011

(30) Foreign Application Priority Data

Dec. 10, 2009 (KR) ........................ 10-2009-0122535

(51) Int. Cl.
*H01L 51/00* (2006.01)
*H01L 51/40* (2006.01)

(52) U.S. Cl.
USPC ........................ 257/40; 257/E51.018; 438/99

(58) Field of Classification Search
None
See application file for complete search history.

(56) References Cited

U.S. PATENT DOCUMENTS

| | | | | |
|---|---|---|---|---|
| 5,610,438 | A | * | 3/1997 | Wallace et al. ............... 257/682 |
| 5,656,889 | A | * | 8/1997 | Niiyama et al. .............. 313/553 |
| 6,004,830 | A | * | 12/1999 | Potter .............................. 438/20 |
| 7,193,364 | B2 | * | 3/2007 | Klausmann et al. .......... 313/512 |
| 2004/0108811 | A1 | | 6/2004 | Klausmann et al. |
| 2005/0238908 | A1 | | 10/2005 | Hikmet et al. |
| 2007/0266949 | A1 | * | 11/2007 | Shenai-Khatkhate ........ 118/726 |

FOREIGN PATENT DOCUMENTS

| | | |
|---|---|---|
| JP | 2004-119086 | 4/2004 |
| KR | 10-2002-0081951 | 10/2002 |
| KR | 10-2004-0067097 | 7/2004 |
| KR | 1020040106514 A | 12/2004 |
| KR | 10-0531297 | 11/2005 |
| KR | 10-0719506 | 5/2007 |

OTHER PUBLICATIONS

English Abstract for Korean Patent Publication No. 10-2002-0016129.
English Abstract for Korean Patent Publication No. 10-2005-0018092.
Korean Office Action issued by Korean Industrial Property Office on Feb. 8, 2011, corresponding to Korean Patent Application No. 10-2009-0122535 and Request for Entry of the Accompanying Office Action attached herewith.

* cited by examiner

*Primary Examiner* — Steven Loke
*Assistant Examiner* — Kevin Quinto
(74) *Attorney, Agent, or Firm* — Robert E. Bushnell, Esq.

(57) ABSTRACT

An organic light-emitting display device and a method of manufacturing the same, the organic light-emitting display device including: a substrate; a display unit disposed on the substrate; a sealing substrate disposed facing the display unit; a sealant adhering the substrate to the sealing substrate; and a getter formed on surfaces of the substrate, the sealing substrate, and the sealant that face a space formed inside the display device.

14 Claims, 4 Drawing Sheets

ORGANIC LIGHT-EMITTING DISPLAY DEVICE AND METHOD OF MANUFACTURING THE SAME

CROSS-REFERENCE TO RELATED APPLICATION

This application claims the benefit of Korean Patent Application No. 10-2009-0122535, filed on Dec. 10, 2009, in the Korean Intellectual Property Office, the disclosure of which is incorporated herein, by reference.

BACKGROUND

1. Field

The present disclosure relates to an organic light-emitting display device and a method of manufacturing the same.

2. Description of the Related Art

Recently, portable flat panel display devices have increased in popularity. Among flat panel display devices, electroluminescent display devices, which are self-emitting display devices, have attracted attention as the next generation of display devices, because of their wide viewing angle, excellent contrast ratio, and short response time. Organic light-emitting display devices include a light emitting layer formed of an organic material, and form brighter images, have a lower driving voltage, and a shorter response time, as compared to inorganic light-emitting display devices.

FIG. 1 is a cross-sectional view of a conventional organic light-emitting display device. Referring to FIG. 1, a display unit 20 is disposed on a substrate 10, and a sealing substrate 30 is disposed over the display unit 20. The substrate 10 and the sealing substrate 30 are adhered to each other with a sealant 41.

An organic light-emitting device included in a flat panel display device may be degraded by various internal factors. For example, a light emitting layer may be degraded by oxygen from indium tin oxide (ITO) of an electrode, or due to a reaction between the light emitting layer and an interface layer. Such a device may also be degraded by external factors, such as moisture, oxygen, ultraviolet rays, and manufacturing conditions for the organic light-emitting device. In particular, the packaging of the organic light-emitting device is very important, since external oxygen and moisture can drastically reduce the lifetime of the organic light-emitting device.

The conventional organic light-emitting display device of FIG. 1 has a problem in that external impurities, such as oxygen or moisture, may penetrate through the sealant 41. In particular, the impurities may enter through an interface between the sealant 41 and the sealing substrate 30.

SUMMARY

The present disclosure provides an organic light-emitting display device and a method of manufacturing the same, capable of reducing the penetration of external impurities, such as oxygen or moisture.

According to an aspect of the present invention, there is provided an organic light-emitting display device including: a substrate; a display unit disposed on the substrate; a sealing substrate disposed over the display unit; a sealant adhering the substrate to the sealing substrate; and a getter formed on the inner wall surfaces of the substrate, the sealing substrate, and the sealant, so as to surround a space formed inside the device by the inner wall surfaces.

According to an aspect of the present invention, the getter may include at least one metal selected from the group consisting of barium (Ba), calcium (Ca), magnesium (Mg), titanium (Ti), vanadium (V), zirconium (Zr), niobium (Nb), molybdenum (Mo), tantalum (Ta), thorium (Th), and cerium (Ce).

According to an aspect of the present invention, the getter may include at least one metal alloy selected from the group consisting of Ba—Al, Zr—Al, Ag—Ti, and Zr—Ni.

According to an aspect of the present invention, the organic light-emitting display device may further include a passivation layer covering the display unit, wherein the getter is formed on the passivation layer.

According to an aspect of the present invention, the getter may include a metal layer or a metal alloy layer formed around the space between the substrate, the sealing substrate, and the sealant.

According to an aspect of the present invention, a getter material may be formed on a surface of the sealing substrate and then may be locally heated to form the getter, such that the getter completely surrounds the space.

According to an aspect of the present invention, the getter material may be formed on the surface of the sealing substrate, in an inert atmosphere.

According to an aspect of the present invention, the getter may be formed of a material that reacts with moisture and oxygen.

According to an aspect of the present invention, the sealant may be disposed along edges of the sealing substrate.

According to another aspect of the present invention, there is provided a method of manufacturing an organic light-emitting display device, the method including: forming a display unit on a surface of a substrate; forming a sealant and a getter material on a surface of a sealing substrate; adhering the substrate to the sealing substrate with the sealant; and forming a getter around a space formed between the substrate, the sealing substrate, and the sealant.

According to an aspect of the present invention, the method may further include forming a passivation layer that covers the display unit.

The forming of the getter may include locally heating the getter material formed on the sealing substrate, such that the getter is formed to completely cover wall surfaces of the substrate, the sealing substrate, and the sealant that face the space.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the present invention will become apparent and more readily appreciated from the following description of the exemplary embodiments, taken in conjunction with the accompanying drawings, of which.

DETAILED DESCRIPTION

Figure 1:
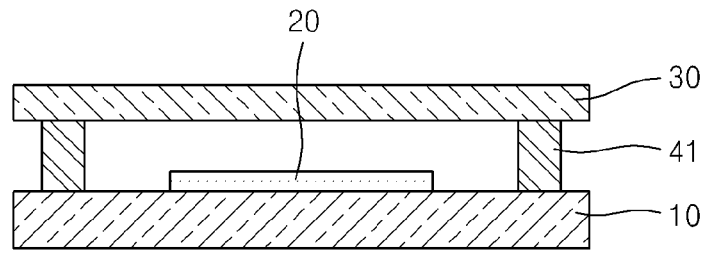
FIG. 1 is a conventional organic light-emitting display device.

Reference will now be made in detail to the exemplary embodiments of the present invention, examples of which are illustrated in the accompanying drawings, wherein like reference numerals refer to the like elements throughout. The exemplary embodiments are described below, in order to explain the aspects of the present invention, by referring to the figures.

Herein, when a first element is referred to as being formed or disposed "on" a second element, the first element can be disposed directly on the second element, or one or more other elements may be disposed therebetween. When a first element is referred to as being formed or disposed "directly on" a second element, no other elements are disposed therebetween. In addition, when a first element is described as being "connected to" a second element, the first element may be directly connected to the second element, or may be indirectly connected to the second element, via one or more intervening elements.

Figure 2:
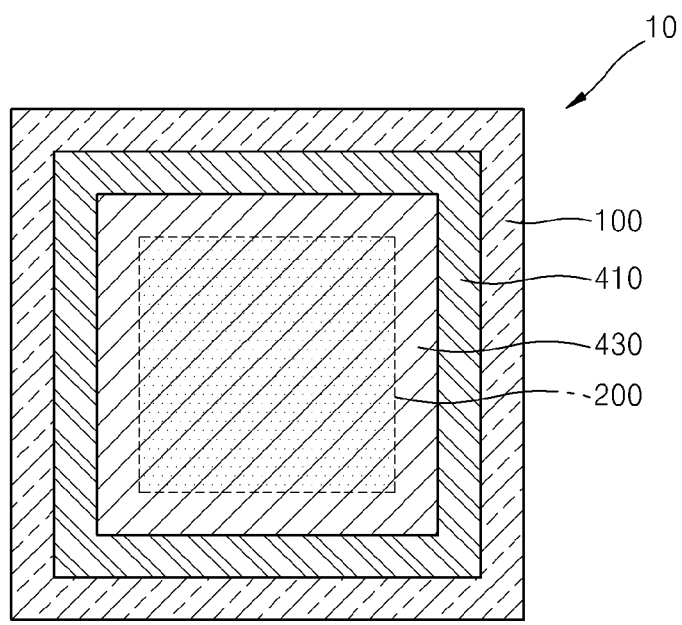
FIG. 2 is a plan view of an organic light-emitting display device, according to an exemplary embodiment of the present invention.
Figure 3:
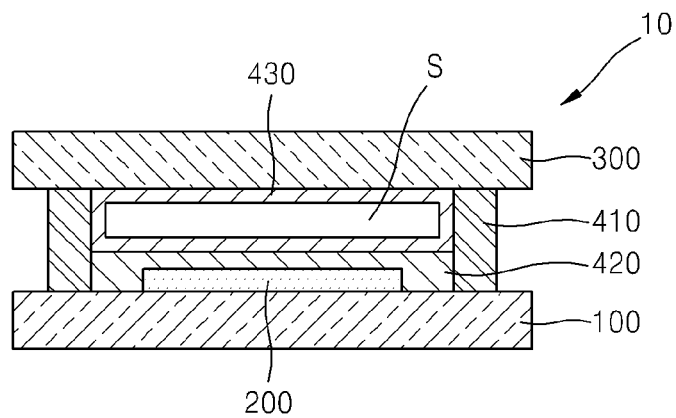
FIG. 3 is a cross-sectional view of the organic light-emitting display device of FIG. 2.

FIG. 2 is a plan view of an organic light-emitting display device 10, according to an exemplary embodiment of the present invention. FIG. 3 is a cross-sectional view of the organic light-emitting display device 10 of FIG. 2. For reference, a sealing substrate 300 illustrated in FIG. 3 is not shown in FIG. 2. Referring to FIGS. 2 and 3, a display unit 200, including an organic light-emitting device, is disposed on a portion of a substrate 100.

The substrate 100 may be formed of a transparent glass material, of which $SiO_2$ is a main component. However, the present embodiment is not limited thereto, as the substrate 100 may be formed of a transparent plastic material, for example. The transparent plastic material may be an organic material selected from the group consisting of polyethersulphone (PES), polyacrylate (PAR), polyetherimide (PEI), polyethyelenen napthalate (PEN), polyethyeleneterepthalate (PET), polyphenylene sulfide (PPS), polyallylate, polyimide, polycarbonate (PC), cellulose triacetate (TAC), and cellulose acetate propionate (CAP).

If the organic light-emitting display device 10 is a bottom-emission organic light-emitting display device, which displays an image though the substrate 100, the substrate 100 should be formed of a transparent material. However, if the organic light-emitting display device 10 is a top-emission organic light-emitting display device, which displays an image in a direction away from the substrate 100, the substrate 100 is need not be formed of a transparent material. In this case, the substrate 100 may be formed of a metal. If the substrate 100 is formed of a metal, the substrate 100 may include, but not limited to, at least one selected from the group consisting of carbon, iron, chrome, manganese, nickel, titanium, molybdenum, stainless steel (SUS), an Invar alloy, an Inconel alloy, and a Kovar alloy. The substrate 100 may be formed of a metal foil.

A buffer layer (not shown) may be further disposed on a top surface of the substrate 100. The buffer layer may planarize the substrate 100 and prevent impurities from diffusing into/out of the substrate 100.

The substrate 100 is adhered to the sealing substrate 300, such that the sealing substrate is disposed over the display unit 200. The sealing substrate 300 may be a glass substrate or any of various plastic substrates, such as an acrylic substrate. Alternatively, the sealing substrate 300 may be formed of a metal.

The substrate 100 and the sealing substrate 300 are adhered to each other with a sealant 410. A typical sealing material, such as a sealing glass frit, may be used as the sealant 410. The sealant 410 may be an organic sealant, an inorganic sealant, an organic/inorganic composite sealant, or a mixture thereof.

The organic sealant may be at least one sealant selected from the group consisting of an acryl-based resin, a methacryl-based resin, polyisoprene-based resin, a vinyl-based resin, an epoxy-based resin, a urethane-based resin, and a cellulose-based resin. The acryl-based resin may be butylacrylate, ethylhexylacrylate, or the like. The methacryl-based resin may be propyleneglycolmethacrylate, tetrahydrofufuryl methacrylate, or the like. The vinyl-based resin may be vinylacetate, N-vinylpyrrolidone, or the like. The epoxy-based resin may be cycloaliphatic epoxide, epoxy acrylate, or the like. The urethane-based resin may be urethane acrylate or the like. The cellulose-based resin may be cellulosenitrate, or the like.

The inorganic sealant may be an inorganic material, such as metallic or non-metallic material containing silicon, aluminum, titanium, or zirconium, and should easily mix with a water vapor absorption material form a film. For example, the inorganic sealant may include at least one material selected from the group consisting of titania, silicon oxide, zirconia, alumina, and precursors thereof.

The organic/inorganic composite sealant is an organic/inorganic composite in which a metallic or non metallic material, such as silicon, aluminum, titanium, or zirconium, is connected to an organic material through a covalent bond. For example, the organic/inorganic composite sealant may include at least one sealant selected from the group consisting of an epoxy silane or derivative thereof, a vinyl silane or derivative thereof, an amine silane or derivative thereof, a methacrylate silane or derivative thereof, a methalcryloxy silane or derivative thereof, and a partially cured product thereof. The epoxy silane or derivative thereof may be 3-glycidoxypropyltrimethoxysilane or a polymer thereof. The vinyl silane or derivative thereof may be vinyltriethoxysilane or a polymer thereof. The amine silane or derivative thereof may be 3-aminopropyltriethoxysilnae or a polymer thereof. The methacrylate silane or derivative thereof may be 3-(trimethoxysilyl)propyl acrylate or a polymer thereof.

A passivation layer 420 is formed on the display unit 200. The passivation layer 420 may be formed of an organic material, such as acryl, polyimide, or benzocyclobutene (BCB), or an inorganic material, such as $SiO_2$ or $SiN_x$.

A getter 430 is disposed on wall surfaces of a space S formed inside of the organic light-emitting display device 10. The space S is a sealed area disposed between portions of the passivation layer 420, the sealing substrate 300, and the sealant 410. In other words, the getter 430 disposed around the space S.

As described above, the sealant 410 may be an organic sealant or an inorganic sealant. If the sealant 410 is an inorganic sealant, which exhibits very low water vapor permeation, the lifetime of the organic light-emitting display device 10 may be prevented from being reduced. However, since an inorganic material may be brittle, an inorganic sealant may break or crack under external impacts or distortions, thereby resulting in the penetration of moisture into the organic light-emitting device. If the sealant 410 is an organic sealant, such mechanical reliability is improved. However, since an organic material has a high water vapor permeation rate, the lifetime of the organic light-emitting display device 10 may not be maintained.

To solve these and/or other problems, the organic light-emitting display device 10 includes the getter 430 formed on the inner wall surface of the space. In detail, a getter refers to a material that adsorbs gas remaining in a vacuum device or generates a compound by reacting with the gas. A getter is generally used when a desired vacuum degree may be obtained technically and financially with only a vacuum pump. A getter may be a contact getter or a dispersion getter, according to the state of a getter material and the extent of a chemical reaction thereof. A contact getter is a getter that is in a solid state and adsorbs gas, whereas a dispersion getter is a getter that is in a gas state and chemically reacts with a gas.

In FIG. 2, the getter 430 is formed from a getter material. The getter material may include a metal that has high reactivity with moisture and oxygen, low melting point, and high volatility. Moisture or gas penetrating into the panel is adsorbed into the metal. The getter material may include a metal such as barium (Ba), calcium (Ca), magnesium (Mg), titanium (Ti), vanadium (V), zirconium (Zr), niobium (Nb), molybdenum (Mo), tantalum (Ta), thorium (Th), or cerium (Ce), or a metal alloy such as Ba—Al, Zr—Al, Ag—Ti, or Zr—Ni.

For example, if nickel (Ni) is mixed with $BaAl_4$ and a resultant structure is locally heated by means of radio frequency (RF) or the like, for a short time, the following reaction takes place.

$$BaAl_4 + 4Ni \rightarrow Ba + 4NiAl$$

The barium (Ba) is diffused onto surfaces adjacent to surfaces to which the $BaAl_4$ is applied, such as walls of the space S. The barium formed by the reaction adsorbs moisture to form barium hydroxide, the barium hydroxide reacts with oxygen to form barium oxide, and the barium oxide reacts with $CO_2$ or the like, to form barium carbonate. Barium hydroxide is transparent, and barium oxide and barium carbonate are white. The above reactions are irreversible.

If the getter material includes zirconium (Zr) is used, the following reaction takes place.

$$Zr + O_2 \rightarrow ZrO_2$$

Since getter materials including barium (Ba) and/or zirconium (Zr) may adsorb $H_2$, $O_2$, $N_2$, CO, $CO_2$, $H_2O$, and the like and have high reactivity, if the getter material is coated on an inner wall surfaces of the space S of the organic light-emitting display device 10, external moisture or the like may be removed. Thus, the getter material prevents a reduction in the lifetime of the device 10.

Since the getter 430 is coated on the inner surfaces of the space S, which is formed by sealing together the passivation layer 420, the sealing substrate 300, and the sealant 410, moisture and oxygen may be prevented from penetrating into the device 10 and degrading the display unit 200. In addition, any moisture and oxygen that does enter the device 10 may be adsorbed by the getter 430.

In order to preserve the adsorptive properties of the getter material, the getter material is inserted into the organic light-emitting display device 10 under an inert atmosphere. Then the device 10 is sealed with the sealant 410. Also, when a portion of the device 10 where the getter material exists is locally activated through induction heating, the entire inner surface of the space S of organic light-emitting display device 10 is coated.

The getter 430 may be densely formed so as to act as a mirror. Even if a small amount of moisture passes through the sealant 410, the moisture penetrating into the organic light-emitting display device 10 is adsorbed by to the getter 430. Since the moisture penetrating into the organic light-emitting display device 10 is adsorbed by the getter 43, the moisture is prevented from reducing the lifetime of the organic light-emitting display device 10.

Figure 4:
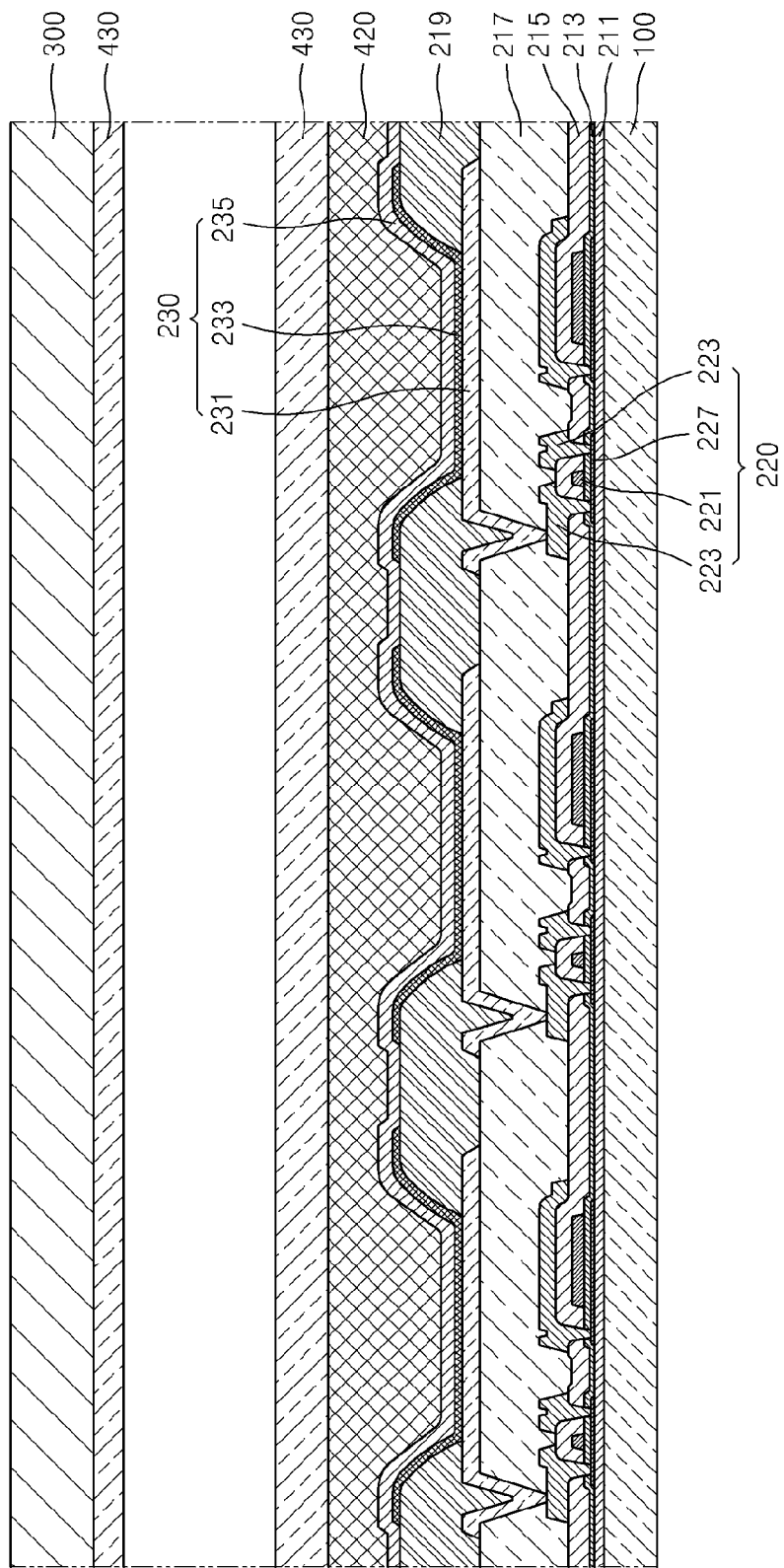
FIG. 4 is a cross-sectional view illustrating a display unit of the organic light-emitting display device of FIG. 2.

FIG. 4 is a cross-sectional view illustrating the display unit 200 of the organic light-emitting display device 10 of FIG. 2. Referring to FIG. 4, a plurality of thin film transistors (TFTs) 220 are disposed on the substrate 100. An organic light-emitting device 230 is disposed over each of the TFTs 220. The organic light-emitting device 230 includes a pixel electrode 231 electrically connected to each of the TFTs 220, a counter electrode 235 disposed over the entire surface of the substrate 100, and an intermediate layer 233 disposed between the pixel electrode 231 and the counter electrode 235, including at least one light emitting layer.

The TFTs 220 each including a gate electrode 221, source and drain electrodes 223, a semiconductor layer 227, a gate insulating layer 213, and an inter-layer insulating layer 215 are disposed on the substrate 100. The present embodiment is not limited thereto, and the TFTs 220 may be, for example, organic TFTs including the semiconductor layer 227 formed of an organic material, or silicon TFTs including the semiconductor layer 227 formed of silicon. A buffer layer 211 formed of a silicon oxide or a silicon nitride may be further disposed between the TFTs 220 and the substrate 100.

The pixel electrodes 231 and the counter electrode 235 are disposed facing each other. The intermediate layer 233 is formed of an organic material and is disposed between the pixel electrodes 231 and the counter electrode 235. The intermediate layer 233 may include at least one light emitting layer. A plurality of the intermediate layers 233 may be provided, as will be explained later.

The pixel electrode 231 may operate as an anode and the counter electrode 235 may operate as a cathode. Of course, the pixel electrode 231 may operate as a cathode and the counter electrode 235 may operate as an anode.

The pixel electrode 231 may be a transparent electrode or a reflective electrode. If the pixel electrode 231 is a transparent electrode, the pixel electrode 231 may be formed of indium tin oxide (ITO), indium zinc oxide (IZO), zinc oxide (ZnO), or indium oxide ($In_2O_3$). If the pixel electrode 231 is a reflective electrode, the pixel electrode 231 may include a reflective layer formed of silver (Ag), magnesium (Mg), aluminum (Al), plutonium (Pt), palladium (Pd), gold (Au), nickel (Ni), neodymium (Nd), iridium (Ir), chromium (Cr), or a combination thereof, and a transparent layer formed of ITO, IZO, ZnO, or $In_2O_3$ disposed on the reflective layer.

The counter electrode 235 may be a transparent electrode or a reflective electrode. If the counter electrode 235 is a transparent electrode, the counter electrode 235 may include a layer that is formed by depositing lithium (Li), calcium (Ca), lithium fluoride/calcium (LiF/Ca), lithium fluoride/aluminum (LiF/Al), aluminium (Al), magnesium (Mg), or a compound thereof, facing the intermediate layer 233, between the pixel electrode 231 and the counter electrode 235. An auxiliary electrode or bus electrode line, formed of a transparent conductive material such as ITO, IZO, ZnO, or $In_2O_3$, may be disposed on the layer. If the counter electrode 235 is a reflective electrode, the counter electrode 235 may be formed by depositing Li, Ca, LiF/Ca, LiF/Al, Al, Mg, or a compound thereof.

A pixel-defining layer (PDL) 219 covers edge portions of the pixel electrodes 231 and extends between the pixel electrodes 231. The PDL 219 defines a light emitting area of each light-emitting device 230, and prevents an electric field from concentrating on the edge portions of the pixel electrode 231, by increasing a distance between the edge portions and the counter electrode 235, thereby preventing a short circuit between the pixel electrode 231 and the counter electrode 235.

The intermediate layer 233 is disposed between the pixel electrode 231 and the counter electrode 235. The intermediate layer 233 may be formed of a low molecular weight organic material or a high molecular weight organic material.

If the intermediate layer 233 is formed of a low molecular weight organic material, the intermediate layer 233 may be formed by stacking a hole injection layer (HIL), a hole transport layer (HTL), an emission layer (EML), an electron transport layer (ETL), and an electron injection layer (EIL). Each of these layers may have a single or multi-layer structure. Examples of the low molecular weight organic material include copper phthalocyanine (CuPc), N,N'-Di(naphthalene-1-yl)-N,N'-diphenyl-benzidine (NPB), and tris-8-hydroxyquinoline aluminum)(Alq3). The low molecular weight organic materials may be deposited by vacuum deposition or the like using masks.

If the intermediate layer 233 is formed of a high molecular weight organic material, the intermediate layer 233 includes an HTL and an EML. The HTL is formed of poly-(2,4)-ethylene-dihydroxy thiophene (PEDOT), and the EML is formed of a high molecular weight organic material, such as poly-phenylenevinylene (PPV) or polyfluorene.

The organic light-emitting device 230 is electrically connected to each of the TFTs 220. If a planarization layer 217 covers the TFTs 220, the organic light-emitting device 230 is disposed on the planarization layer 217, and the pixel electrode 231 of the organic light-emitting device 230 is electrically connected to each of the TFTs 220 through a contact hole formed in the planarization layer 217.

The organic light-emitting device 230 is sealed by the sealing substrate 300, the substrate 100, and the sealant 410. The sealing substrate 300 may be formed of any of various materials, such as glass or plastic, as described above.

The getter 430 is formed on surfaces of the passivation layer 420 and the sealing substrate 300. Thus, the penetration of external impurities, such as oxygen or moisture, may be efficiently prevented.

FIGS. 5A through 5E are cross-sectional views illustrating a method of manufacturing the organic light-emitting display device 10 of FIG. 2, according to an exemplary embodiment of the present invention. Referring to FIGS. 5A through 5E, the method includes: forming a display unit on a portion of a surface of a substrate; forming a passivation layer on the display unit; forming a sealant and a getter material on a surface of a sealing substrate; adhering the substrate to the sealing substrate with the sealant; and forming the getter material to completely cover inner walls of the sealing substrate, the passivation layer, and the sealant, which surround the space.

Figure 5A:
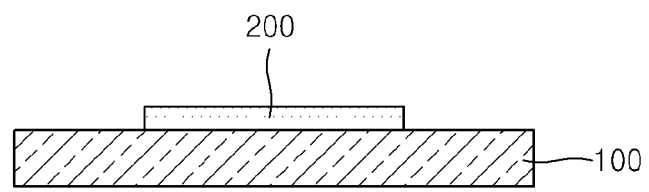
FIGS. 5A through 5E are cross-sectional views illustrating a method of manufacturing the organic light-emitting display device of FIG. 2, according to an exemplary embodiment of the present invention.

Referring to FIG. 5A, the display unit 200 is formed on a surface of the substrate 100. The substrate 100 may be a glass substrate or any of various plastic substrates such as an acrylic substrate. Alternatively, the substrate 100 may be a metal substrate. A buffer layer (not shown) may be further disposed on the substrate 100.

Figure 5B:
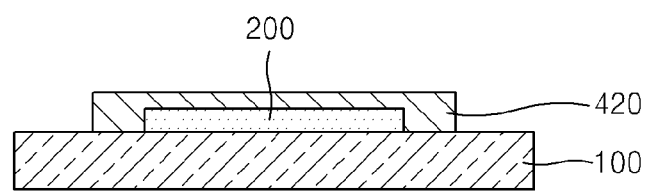

Referring to FIG. 5B, the passivation layer 420 is formed on the display unit 200. The passivation layer 420 may be formed of an organic material, such as acryl, polyimide, or BCB, or an inorganic material such as $SiO_2$ or $SiN_x$.

Figure 5C:
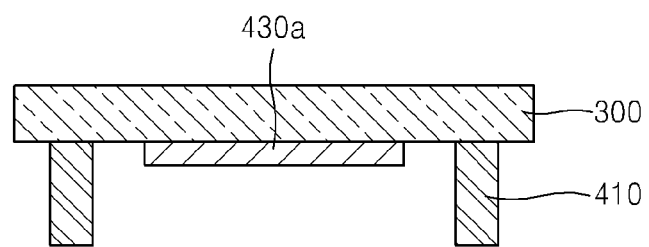

Referring to FIG. 5C, the sealing substrate 300 is prepared. The sealing substrate 300 may be a glass substrate, or a plastic substrate such as an acrylic substrate. Alternatively, the sealing substrate 300 may be a metal substrate. The sealant 410 is formed on a surface of the sealing substrate 300. The sealant 410 may be an organic sealant, an inorganic sealant, an organic/inorganic composite sealant, or a mixture thereof. A getter material 430a is formed on an inner surface of the sealing substrate 300, inside of the sealant 410. The getter material 430a may include a metal that has high reactivity with moisture and oxygen, a low melting point, and a high volatility, in order to adsorb/remove moisture and/or gas penetrating into the panel. For example, the getter material 430 may include a metal such as, Ba, Ca, Mg, Ti, V, Zr, Nb, Mo, Ta, Th, or Ce, or a metal alloy such as Ba—Al, Zr—Al, Ag—Ti, or Zr—Ni.

Figure 5D:
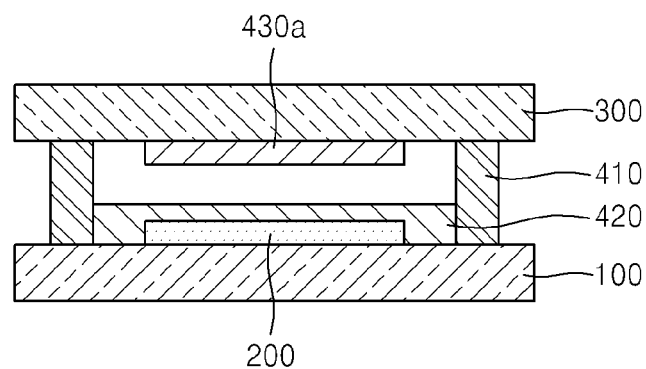

Referring to FIG. 5D, the substrate 100 is adhered to the sealing substrate 300 with the sealant 410. That is, the substrate 100 is adhered to the sealing substrate 300 by locally radiating a laser beam onto the sealant 410, so as to harden the sealant 410.

Figure 5E:
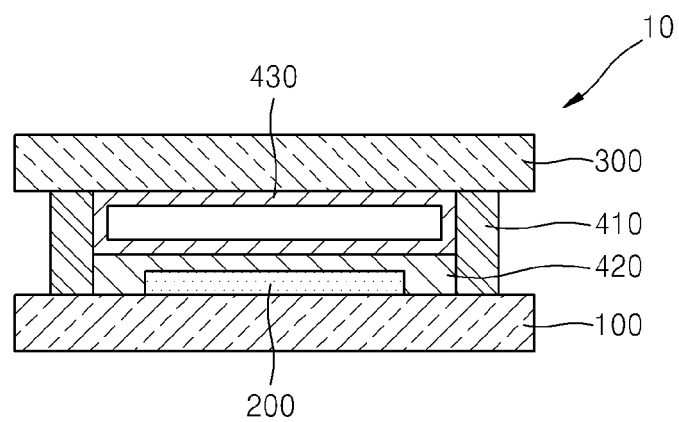

Referring to FIG. 5E, the getter 430 is formed to entirely cover wall surfaces of a space formed in the organic light-emitting display device 10. The space is formed between the passivation layer 420, the sealing substrate 300, and the sealant 410. That is, after the substrate 100 is adhered to the sealing substrate 300 with the sealant 410, only the getter material 430a is locally activated, by induction heating. Accordingly, the getter 430 is formed completely around the space formed in the organic light-emitting display device 10. Since the getter 430 is densely formed, the getter 430 may function as a mirror. Even if a small amount of moisture passes through the sealant 410, the amount of the moisture that penetrates into the organic light-emitting display device 10 is drastically reduced, due to the getter 430. Since even the moisture that has penetrated into the organic light-emitting display device 10 is adsorbed by the getter 430, the lifetime of the organic light-emitting display device 10 is prevented from being reduced.

As described above, the organic light-emitting display device and the method of manufacturing the same, according to aspects of the present invention, may effectively prevent penetration of external impurities, such as oxygen and/or moisture.

Although a few exemplary embodiments of the present invention have been shown and described, it would be appreciated by those skilled in the art that changes may be made in these exemplary embodiments, without departing from the principles and spirit of the invention, the scope of which is defined in the claims and their equivalents.

What is claimed is:

1. An organic light-emitting display device comprising:
    a substrate;
    a display unit disposed on the substrate;
    a sealing substrate disposed facing the display unit;
    a sealant disposed around the display unit, between the substrate and the sealing substrate; and
    a getter disposed completely surrounding a space formed inside the device, between the substrate, the sealing substrate, and the sealant, said space not containing the display unit.

2. The organic light-emitting display device of claim 1, wherein the getter comprises at least one metal selected from the group consisting of barium (Ba), calcium (Ca), magnesium (Mg), titanium (Ti), vanadium (V), zirconium (Zr), niobium (Nb), molybdenum (Mo), tantalum (Ta), thorium (Th), and cerium (Ce).

3. The organic light-emitting display device of claim 1, wherein the getter comprises at least one metal alloy selected from the group consisting of Ba—Al, Zr—Al, Ag—Ti, and Zr—Ni.

4. The organic light-emitting display device of claim 1, further comprising a passivation layer covering the display unit, wherein the getter is disposed on the passivation layer.

5. The organic light-emitting display device of claim 1, wherein the getter is formed by locally heating a getter material applied to a surface of the sealing substrate.

6. The organic light-emitting display device of claim 5, wherein the getter material is applied to the sealing substrate, under an inert atmosphere.

7. The organic light-emitting display device of claim 1, wherein the getter reacts with moisture and oxygen.

8. The organic light-emitting display device of claim 1, wherein the sealant is disposed on edges of the sealing substrate, around the display unit.

9. An organic light-emitting display device, comprising:
   a substrate;
   a display unit disposed on the substrate:
   a sealing substrate disposed facing the display unit;
   a sealant disposed around the display unit, between the substrate and the sealing substrate; and
   a getter disposed completely around a space formed inside the device, between the substrate, the sealing substrate, and the sealant,
   wherein the getter comprises a metal layer or a metal alloy layer formed directly on surfaces of the substrate, the sealing substrate, and the sealant that face the space.

10. A method of manufacturing an organic light-emitting display device, comprising:
    forming a display unit on a surface of a substrate;
    applying a sealant and a getter material to a surface of a sealing substrate;
    adhering the substrate to the sealing substrate with the sealant; and
    forming a getter completely surrounding a space formed inside the device, between the substrate, the sealing substrate, and the sealant, using the getter material, said space not containing the display unit.

11. The method of claim 10, further comprising foaming a passivation layer that covers the display unit.

12. The method of claim 10, wherein the forming of the getter comprises locally heating the getter material.

13. The method of claim 10, wherein the applying of the getter material is performed under an inert atmosphere.

14. A method of manufacturing an organic light-emitting display device, comprising:
    forming a display unit on a surface of a substrate;
    applying a sealant and a getter material to a surface of a sealing substrate;
    adhering the substrate to the sealing substrate with the sealant and
    forming a getter completely around a space formed inside the device, between the substrate, the sealing substrate, and the sealant, using the getter material,
    wherein the forming of the getter comprises locally heating the getter material, and
    wherein the localized heating of the getter material comprises diffusing the getter material into walls of the substrate, the sealing substrate, and the sealant that face the space.

* * * * *